(12) United States Patent
Wu et al.

(10) Patent No.: US 12,362,028 B2
(45) Date of Patent: Jul. 15, 2025

(54) MEMORY TEST CIRCUIT, MEMORY CHIP, AND TESTING METHOD OF MEMORY CHIP

(71) Applicant: Taiwan Semiconductor Manufacturing Company, Ltd., Hsinchu (TW)

(72) Inventors: Jui-Jen Wu, Hsinchu (TW); Jen-Chieh Liu, Hsinchu (TW); Yi-Lun Lu, New Taipei (TW); Win-San Khwa, Taipei (TW); Meng-Fan Chang, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 252 days.

(21) Appl. No.: 18/153,356

(22) Filed: Jan. 12, 2023

(65) Prior Publication Data

US 2024/0079075 A1   Mar. 7, 2024

Related U.S. Application Data

(60) Provisional application No. 63/403,868, filed on Sep. 6, 2022.

(51) Int. Cl.
 *G11C 29/18* (2006.01)
 *G11C 29/12* (2006.01)
 *G11C 29/36* (2006.01)
(52) U.S. Cl.
 CPC ........ *G11C 29/12015* (2013.01); *G11C 29/18* (2013.01); *G11C 29/36* (2013.01); *G11C 2029/3602* (2013.01)

(58) Field of Classification Search
 CPC ... G11C 29/12015; G11C 29/18; G11C 29/36; G11C 2029/3602; G11C 29/16
 See application file for complete search history.

(56) References Cited

U.S. PATENT DOCUMENTS

| | | | | |
|---|---|---|---|---|
| 5,173,906 A * | 12/1992 | Dreibelbis | .............. | G06F 11/27 |
| | | | | 714/E11.169 |
| 6,367,042 B1 * | 4/2002 | Phan | .................. | G01R 31/3187 |
| | | | | 714/733 |
| 6,769,081 B1 * | 7/2004 | Parulkar | ................ | G11C 29/16 |
| | | | | 714/733 |

(Continued)

*Primary Examiner* — Hoai V Ho
*Assistant Examiner* — Justin Bryce Heisterkamp
(74) *Attorney, Agent, or Firm* — JCIPRNET

(57) ABSTRACT

A memory test circuit is provided. The memory test circuit is disposed in a memory chip and electrically coupled to a memory macro of the memory chip. A high speed clock receives an input signal and an external clock signal. The input signal includes a plurality of test bits. A finite state machine controller provides a pattern type. A pattern generator generates and provides a test signal to at least one memory cell of the memory chip to write the test signal to the at least one memory cell based on the pattern type and the external clock signal. A test frequency of the test signal is determined based on the high speed clock. An output comparator outputs a comparison signal based on a difference between the test signal and a readout signal corresponding to the test signal read from the at least one memory cell.

20 Claims, 5 Drawing Sheets

(56) References Cited

U.S. PATENT DOCUMENTS

| | | | | |
|---|---|---|---|---|
| 7,114,113 B2* | 9/2006 | Yonaga | ............ | G01R 31/31723 |
| | | | | 714/744 |
| 7,203,873 B1* | 4/2007 | Adams | ............... | G11C 29/1201 |
| | | | | 714/733 |
| 7,360,116 B2* | 4/2008 | Nakamura | ......... | G01R 31/3187 |
| | | | | 714/33 |
| 7,930,601 B2* | 4/2011 | Eckelman | ........ | G11C 29/12015 |
| | | | | 714/719 |
| 11,309,048 B2* | 4/2022 | Choi | ..................... | G06F 9/4498 |
| 11,527,298 B1* | 12/2022 | Darbinyan | .............. | G11C 29/38 |
| 2002/0075740 A1* | 6/2002 | Sung | ...................... | G11C 29/50 |
| | | | | 365/201 |
| 2004/0128596 A1* | 7/2004 | Menon | ........... | G01R 31/318508 |
| | | | | 714/724 |
| 2005/0240842 A1* | 10/2005 | Yonaga | ............ | G01R 31/31723 |
| | | | | 714/724 |
| 2007/0016826 A1* | 1/2007 | Dubey | ................... | G11C 29/40 |
| | | | | 365/201 |
| 2007/0245182 A1* | 10/2007 | Sugiura | ................. | G11C 29/16 |
| | | | | 714/720 |
| 2012/0054564 A1* | 3/2012 | Tiwary | ................... | G11C 29/16 |
| | | | | 714/718 |
| 2013/0326294 A1* | 12/2013 | Lo | .......................... | G11C 29/16 |
| | | | | 714/E11.169 |
| 2017/0205462 A1* | 7/2017 | Mukherjee | ......... | G01R 31/3187 |
| 2018/0277237 A1* | 9/2018 | Maeda | .................... | G11C 29/20 |
| 2021/0057035 A1* | 2/2021 | Hur | ................... | G11C 11/40607 |
| 2022/0254428 A1* | 8/2022 | Adham | .............. | G11C 29/4401 |
| 2023/0069351 A1* | 3/2023 | Fujiwara | .......... | G11C 29/12015 |

* cited by examiner

MEMORY TEST CIRCUIT, MEMORY CHIP, AND TESTING METHOD OF MEMORY CHIP

CROSS-REFERENCE TO RELATED APPLICATION

This application claims the priority benefit of U.S. provisional application Ser. No. 63/403,868, filed on Sep. 6, 2022. The entirety of the above-mentioned patent application is hereby incorporated by reference herein and made a part of this specification.

BACKGROUND

Memory devices are widely used for storing information in a variety of applications. To make sure the stored information is correct, the reliability of the memory device is important. For the evaluation of the reliability of the memory device and the development of the memory device, test signals are written into the memory device and readout signals are read out from the memory macro.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
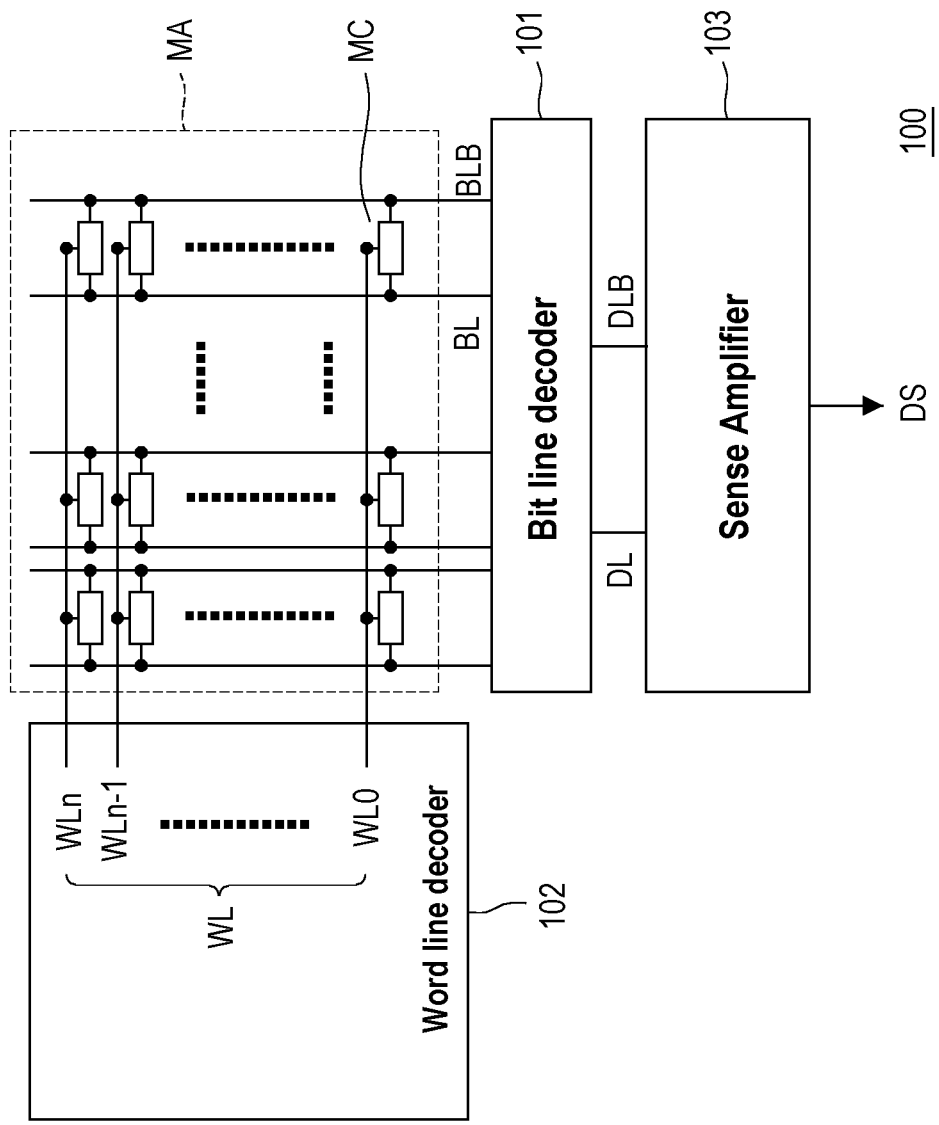
FIG. 1 is a schematic diagram illustrating a memory macro in accordance with some embodiments of the present disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third", "fourth" and the like, may be used herein for ease of description to describe similar or different element(s) or feature(s) as illustrated in the figures, and may be used interchangeably depending on the order of the presence or the contexts of the description.

FIG. 1 is a schematic diagram illustrating a memory macro in accordance with some embodiments of the present disclosure. Referring to FIG. 1, the memory macro 100 includes a memory array MA, a bit line decoder 101, a word line decoder 102, and a sense amplifier 103.

The memory array MA includes memory cells MC, word lines WL, and bit lines BL, BLB. Each memory cell MC includes at least one access transistor (not shown). The word lines WL (i.e., WL0, . . . , WLn−1, WLn) are respectively coupled to a row of the memory cells MC. The bit lines BL, BLB are respectively coupled to a column of the memory cells MC. The sense amplifier 103 is coupled to the bit line decoder 101 through a first data line DL and a second data line DLB.

In one embodiment, the bit line decoder 101 is used to select the voltage signals from the bit lines BL, BLB according to a second address signal (e.g., column selection signal) and output the decoded voltage signals to the first data line DL and the second data line DLB. The word line decoder 102 is used to select the word lines WL according to a first address signal (e.g., row selection signal). The sense amplifier 103 is used to detect a voltage difference between the bit lines BL, BLB. The voltage signals of the bit lines BL, BLB are transmitted to the bit line decoder 101 and then the voltage signals of the bit lines BL, BLB are decoded to be data signals. The decoded data signals on the first data line DL and the second data line DLB may lead to a voltage difference between the first data line DL and the second data line DLB, and then the voltage difference between the first data line DL and the second data line DLB are transmitted to the inputs of the sense amplifier 103. The sense amplifier 103 senses the voltage difference between the first data line DL and the second data line DLB and then outputs a sensing voltage at an output terminal of the sense amplifier circuit related to the read data.

In one exemplary embodiment, the bit lines BL, BLB are attached (electrically coupled) to the sense amplifier (sense amplifier circuits) 103 at the edge of the memory array MA. In some embodiments, the bit lines BL, BLB are attached (electrically coupled) to the bit line decoder 101, and the sense amplifier 103 is attached (electrically coupled) to the bit line decoder 101 through the data lines, for example, the first data line DL and the second data line DLB. As shown in FIG. 1, the memory cells MC located in the same column may be electrically coupled to the sense amplifier 103 using two complementary bit lines BL, BLB.

In some embodiments, the sense amplifier 103 is configured to compare voltages on the associated bit lines BL, BLB, and output a readout signal DS indicating the data stored in a selected memory cell MC during a read operation. In addition, the amplification and readout functions are integrated as one circuit in the sense amplifier 103. In such embodiment, the memory cells MC in the memory array MA are for example, static random access memory (SRAM) type memory cells. In some embodiments, the memory cells MC in the memory array MA are a series of six-transistor SRAM (6T-SRAM). The 6T-SRAM is the SRAM structure of this embodiment, and those who use this embodiment can adjust the number of transistors in the SRAM according to their needs, so as to realize the function of the SRAM. However, this disclosure is not limited thereto.

Moreover, the memory cells MC may further include a first access transistor. A gate terminal of the first access transistor is connected to a word line WL. In addition, a source/drain terminal of the first access transistor is coupled to a first storage node, while the other source/drain terminal of the first access transistor is connected to bit line BL. When the first access transistor is enabled, the bit line BL can charge/discharge the first storage node, or vice versa. Accordingly, logic data can be programmed to the first storage node, or read out from the first storage node. On the other hand, when the first access transistor is in an off state, the first storage node is decoupled from the bit line BL, and logic data cannot be written to or read out from the first storage node. In other words, the first access transistor may control access of the first storage node.

Similarly, access of the second storage node is controlled by a second access transistor. The word line WL for controlling switching of the second access transistor may also be connected to a gate terminal of the second access transistor. In this way, the first access transistor and the second access transistor may be switched simultaneously. In addition, a source/drain terminal of the second access transistor is coupled to a second storage node, while the other source/drain terminal of the first access transistor is connected to a bit line BLB. When the second access transistor is enabled, the bit line BLB can charge/discharge the second storage node, or vice versa. Accordingly, logic data can be programmed to the second storage node, or read out from the second storage node. On the other hand, when the second access transistor is in an off state, the second storage node is decoupled from the bit line BLB, and logic data cannot be written to or read out from the second storage node. During a write operation, the bit lines BL, BLB may receive complementary logic data, in order to overwrite the logic data previously stored at the first storage node and the second storage node. In addition, during a read operation using the sense amplifier 103, both of the bit lines BL, BLB are pre-charged, and one of them is slightly pulled down by the corresponding storage node. By comparing voltage difference of the bit lines BL, BLB, the logic data stored at the first storage node and the second storage node can be read out easily using the sense amplifier 103.

In one embodiment, the memory cell MC includes, for example, NAND flash memory cells, NOR flash memory cells, Static Random Access Memory (SRAM) cells, Dynamic Random Access Memory (DRAM) cells, Magnetoresistive Random Access Memory (MRAM) cells, Phase Change Memory (PCM) cells, Resistive Random Access Memory (ReRAM) cells, 3D XPoint memory cells, ferroelectric random-access memory (FeRAM) cells, and other types of memory cells that are suitable for use within the memory array MA. This disclosure is not limited thereto.

It is noted that, to make sure the stored information is correct, the reliability of the memory device is important. For the evaluation of the reliability of the memory device and the development of the memory device, test signals are written into the memory macro 100 and readout signals are read out from the memory macro 100. However, due to the limitation of the interface of the memory chip where the memory macro 100 is disposed, if the test signals are provided from an external resource, the frequencies of the test signals are confined. Therefore, providing the test signals within the same memory chip where the memory device is disposed is a goal to pursue. In other words, for the high speed memory testing, a memory build-in self-test (BIST) circuit may be adopted.

Figure 2:
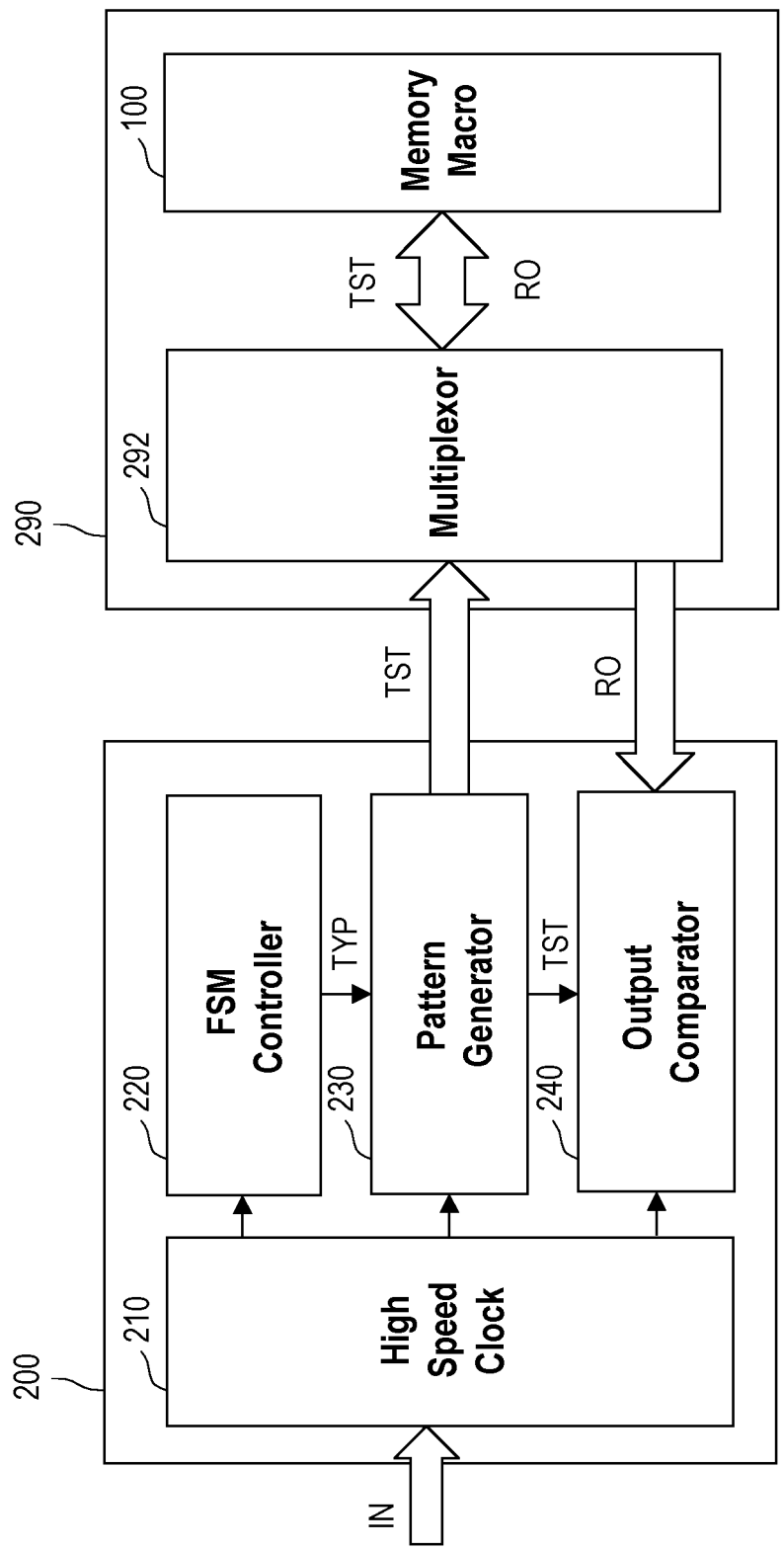
FIG. 2 is a schematic diagram of a memory test circuit in accordance with some embodiments of the present disclosure.

FIG. 2 is a schematic diagram of a memory test circuit in accordance with some embodiments of the present disclosure. Referring to FIG. 1 and FIG. 2, a memory test circuit 200 is disposed in a memory chip and is electrically coupled to a memory macro 100 of the memory chip. In other words, the memory test circuit is embedded in the memory chip where then memory macro 100 is disposed. That is, the memory test circuit 200 is a memory BIST circuit. In one embodiment, the memory macro 100 is disposed in a memory circuit 290 and the memory test circuit 200 is electrically couple to the memory macro 100 though a multiplexor 292 of the memory circuit 290, but this disclosure is not limited thereto.

In one embodiment, the memory test circuit 200 includes a high speed clock 210, a finite state machine (FSM) controller 220, a pattern generator 230, and an output comparator 240. The high speed clock 210 is configured to receive an input signal IN and an external clock signal CLK_EXT (not shown in FIG. 2). In one embodiment, the external clock signal CLK_EXT is included in the input signal IN and is configured to carry the data of the input signal IN. In another embodiment, the external clock signal CLK_EXT and the input signal IN are separately provided to the high speed clock 210, but this disclosure is not limited thereto. In one embodiment, the input signal IN may include a plurality of test bits (i.e., a series of bits). Further, the high speed clock is configured to provide signals with high frequency to the FSM controller 220, the pattern generator 230, and output comparator 240.

The FSM controller 220 is configured to provide a pattern type TYP. In one embodiment, the pattern type TYP is provided by the FSM controller 220 based on the input signal IN, but this disclosure is not limited thereto. In another embodiment, the pattern type TYP is provided by the FSM controller 220 with a predetermined rule (e.g., based on the length of the test bits). In yet another embodiment, the pattern type is provided by the FSM controller 220 randomly (i.e., independent of the input signal IN).

The pattern generator 230 is configured to generate and provide a test signal TST to at least one memory cell MC of the macro 100 of the memory chip to write the test signal TST to the at least one memory cell MC based on the pattern type TYP and the external clock signal CLK_EXT. In one embodiment, a test frequency of the test signal TST is determined based on the external clock signal CLK_EXT.

The output comparator 240 is configured to output a comparison signal CP (not shown in FIG. 2) based on a difference between the test signal TST and a readout signal RO corresponding to the test signal TST read from the at least one memory cell MC. In other words, the output comparator 240 compares the test signal TST with the readout signal RO to obtain the correctness of the data read from the at least one memory cell MC.

In this manner, memory testing may be performed within the memory chip. Further, since the test signal TST is provided by the memory test circuit 200 disposed in the same memory chip where the memory macro 100 is disposed, the frequency of the test signal TST is not limited by the interface of the memory chip. Therefore, the high speed memory testing of the memory macro 100 is achieved by the memory test circuit 200.

Figure 3:
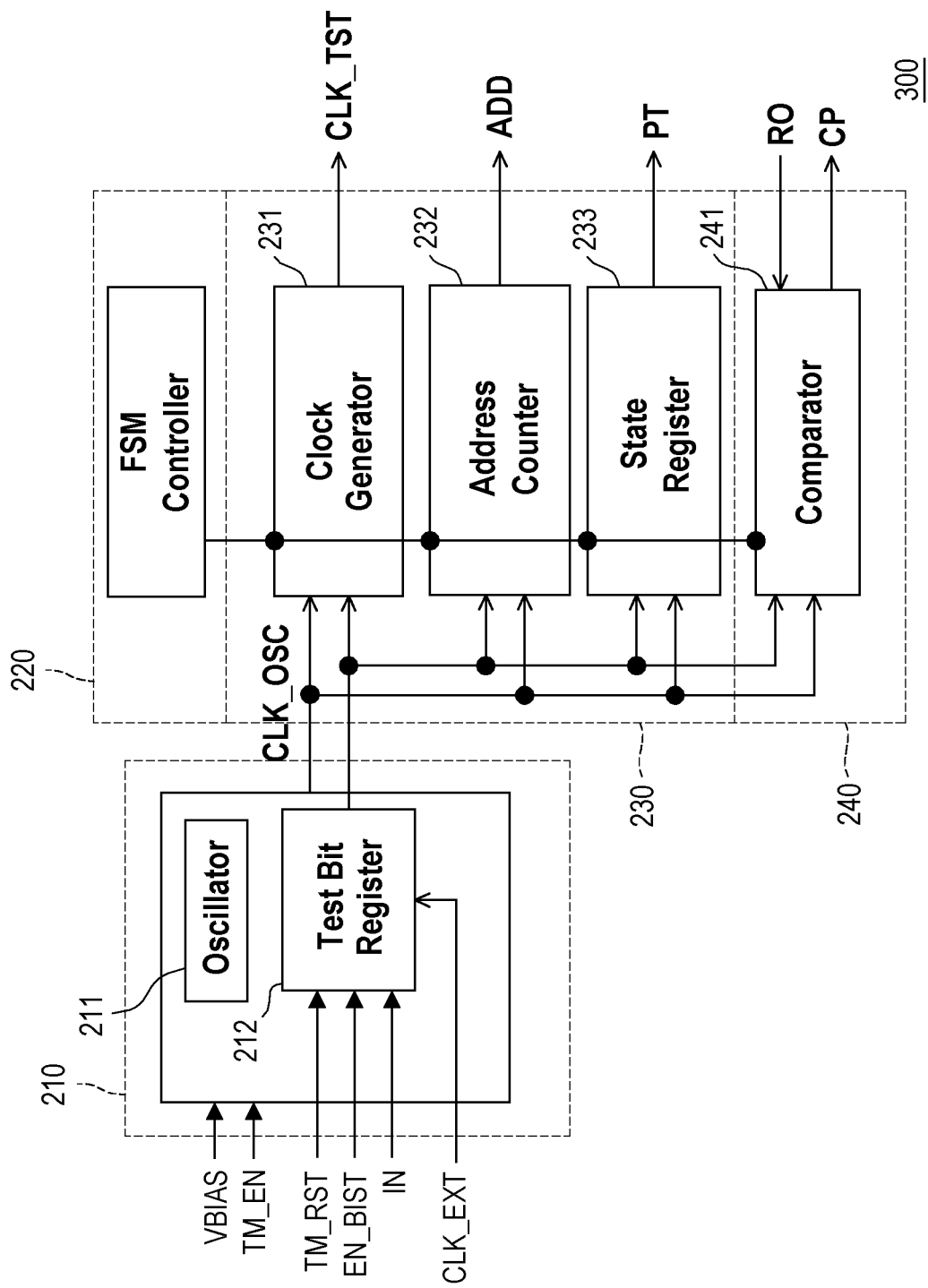
FIG. 3 is a schematic diagram of a memory test circuit in accordance with some embodiments of the present disclosure.

FIG. 3 is a schematic diagram of a memory test circuit in accordance with some embodiments of the present disclosure. Referring to FIG. 1 to FIG. 3, FIG. 3 shows one exemplary embodiment of the memory test circuit 200, but this disclose is not limited thereto. In this embodiment, a memory test circuit 300 includes the high speed clock 210, the FSM controller, the pattern generator 230, and the output comparator 240.

The high speed clock 210 includes an oscillator 211 and a test bit register 212. In one embodiment, the oscillator 211 is a voltage controlled oscillator (e.g., ring oscillator), but this disclosure is not limited thereto. The high speed clock 210 is configured to receive a clock bias voltage VBIAS, a test mode enable signal TM_EN, a test mode reset signal TM_RST, a BIST enable signal EN_BIST, the input signal IN, and the external clock signal CLK_EXT. Further, the high speed clock 210 is configured to output an oscillator clock signal CLK_OSC and a plurality of test bits. In one embodiment, the high speed clock 210 is enabled to start a test bits setting stage according to a BIST enable signal EN_BIST and the speed clock 210 starts a BIST operation stage according to a test mode enable signal TM_EN, but this disclosure is not limited thereto.

In one embodiment, the clock bias voltage VBIAS is provided to the oscillator 211, the test mode enable signal TM_EN is provided to the entire high speed clock 210, and the test mode enable signal TM_EN, the test mode reset signal TM_RST, the BIST enable signal EN_BIST, the input signal IN, and the external clock signal CLK_EXT are provided to the test bit register 212, but this disclosure is not limited thereto. In one embodiment, the oscillator 211 is electrically coupled to the test bit register 212 to exchange the received signals, but this disclosure is not limited thereto. The clock bias voltage VBIAS is configured to determine a frequency of the oscillator clock signal CLK_OSC. In one embodiment, the oscillator clock signal CLK_OSC is directly provided to the memory macro as a work frequency of the memory macro 100. In another embodiment, the oscillator clock signal CLK_OSC is processed first and provided to the memory macro as the work frequency of the memory macro 100, but this disclosure is not limited thereto.

The FSM controller 220 is configured to provide (determine) the pattern type TYP. In one embodiment, in response to receiving the input signal (by the high speed clock 210), the FSM controller 220 is configured to determine the pattern type TYP based on a type bit of the input signal IN. In another embodiment, in response to not receiving the input signal IN, the FSM controller 220 is configured to provide a predetermined pattern type based on a predetermined test data set (including a plurality of (default) test bits) stored in the high speed clock, but this disclosure is not limited thereto. The default test data set is configured to provide to the pattern generator 230 while there is no input signal IN received by the high speed test clock 210. In other words, the default test data set is pre-stored in the test bit register 212 and adopted in case that there is not input signal IN received by the high speed clock 210. That is, the memory test circuit 300 is able to perform BIST operation without the input signal IN. However, if a customized BIST operation is required, the input signal IN is provided to high speed clock 210 to set the test bits different from the default test data set. In one embodiment, after the test bit register 212 is reset, the input signal IN including the test bits are provided to the test bit register 212. In one embodiment, the pattern type TYP includes at least one of a write operation, a read operation, and an erase operation. That is, a patterned signal PT of the test signal TST includes an instruction of at least one of the write operation, the read operation, and the erase operation of the plurality of test bits. In another embodiment, the pattern type TYP includes at least one of a repeated write operation (first write operation), a repeated read operation (first read operation), a repeated erase operation, and an alternative write and read operation. That is, the patterned signal PT of the test signal TST includes an instruction of at least one of the repeated write operation, the repeated read operation, the repeated erase operation, and the alternative write and read operation of the plurality of test bits. In yet another embodiment, the patterned signal PT of the test signal TST includes a plurality of inverted test bits. The plurality of inverted test bits are logically inverted to the plurality of test bits. It should be noted that the pattern type TYP or the patterned signal PT of the aforementioned embodiment may be mixed and recombined based on the design needs, and this disclosure is not limited thereto.

The pattern generator 230 includes a clock generator 231, an address counter 232, and a state register 233. The clock generator 231 is configured to generate a test clock signal CLK_TST based on the oscillator clock signal CLK_OSC. The test clock signal CLK_TST is provided to the memory macro 100 as a work frequency of the memory macro 100. In one embodiment, the test clock signal CLK_TST is included in the test signal TST. In another embodiment, the test clock signal CLK_TST and the test signal TST are provided to the memory macro 100 separately. In one embodiment, the clock generator 231 is configured to further receive the test bits of the input signal IN from the high speed clock 210, but this disclosure is not limited thereto. In one embodiment, the clock generator 231 is a frequency divider for dividing the oscillator clock signal CLK_OSC within a work frequency range of the memory macro 100, but this disclosure is not limited thereto. In one embodiment, the CLK_TST is same as the CLK_OSC (without frequency dividing). In another embodiment, the CLK_TST is different from the CLK_OSC due to the frequency dividing performed by the clock generator 231, but this disclosure is not limited thereto.

The address counter 232 is configured to generate an address signal ADD of the test signal TST based on the input signal IN. The address signal ADD is configured to indicate an address (or an address range) of the at least one memory cell for writing the test signal TST. In one embodiment, the address signal ADD is determined based on the test bits of the input signal IN. In another embodiment, the address signal ADD is determined based on the pattern type TYP provided by the FSM controller 220, but this disclosure is not limited thereto. In one embodiment, the address signal ADD is included in the test signal TST. In another embodiment, the address signal ADD and the test signal TST are provided to the memory macro 100 separately.

The state register 233 is configured to receive the pattern type TYP from the FSM controller 220, receive the test bits from the high speed clock 210, and generate a patterned signal PT based on the test bits and the pattern type TYP. In one embodiment, the patterned signal PT is included in the test signal TST. In another embodiment, the patterned signal PT and the test signal TST are provided to the memory macro 100 separately. In one embodiment, in responding to finishing generating the patterned signal PT, the state register 233 is configured to provide a stop testing signal to the memory macro 100, but this disclosure is not limited thereto.

The output comparator 240 includes a comparator 241. In one embodiment, the comparator 241 is configured to receive the test signal from the pattern generator 230, receive the read out signal RO from the memory macro 100, and output a comparison signal CP based on a difference between the patterned signal PT of the test signal TST and the readout signal RO corresponding to the test signal TST read from the at least one memory cell MC. In other words, the comparator 241 is configured to compare the test signal TST with the readout signal RO to obtain the correctness of the data read from the at least one memory cell MC. In one embodiment, the comparison signal CP is configured to indicate the BIST operation of the at least one memory cell MC succeeded (pass) or failed the BIST operation and output the result for further operations. In one embodiment, in response to the at least one memory cell MC failed the BIST operation, the memory test circuit 300 outputs the address of the at least one memory cell MC to prevent the at least one memory cell MC from further access (e.g., by blocking the at least one memory cell MC).

In this manner, memory testing may be performed within the memory chip. Further, since the test signal TST is provided by the build-in circuit (e.g., memory test circuit 200 or memory test circuit 300) disposed (e.g., embedded) in the same memory chip where the memory macro 100 is disposed, the frequency of the test signal TST is not limited by the interface of the memory chip. Therefore, the high speed memory testing of the memory macro 100 is achieved by the testing method.

Figure 4:
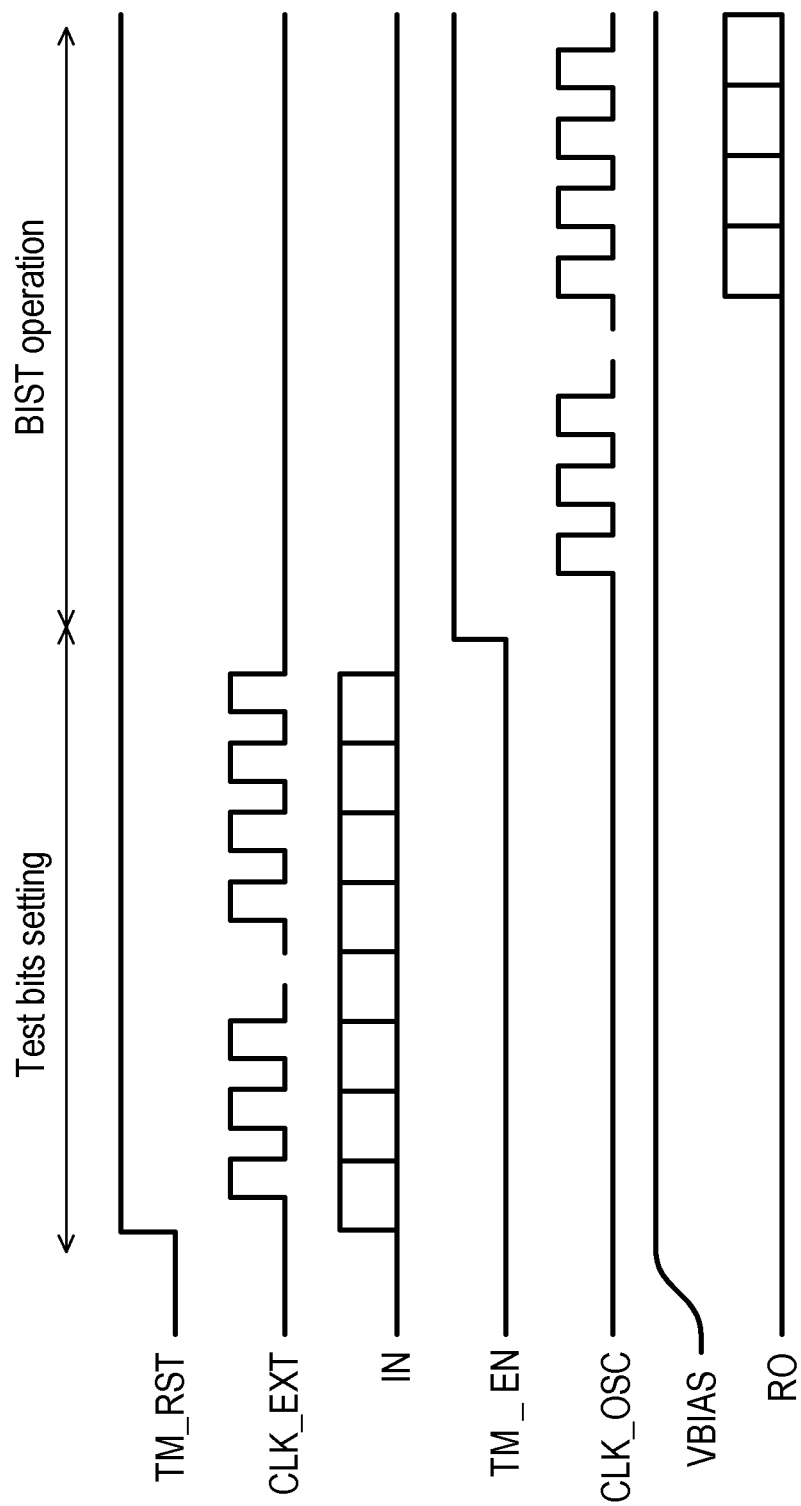
FIG. 4 is a timing chart of a high speed clock in accordance with some embodiments of the present disclosure.

FIG. 4 is a timing chart of a high speed clock in accordance with some embodiments of the present disclosure. Referring to FIG. 1 to FIG. 4, FIG. 4 shows one exemplary timing chart of the high speed clock 210 of the memory test circuit 200 or memory test circuit 300, but this disclosure is not limited thereto. In one embodiment, the timing chart includes two stages: test bits setting stage and BIST operation stage. The test bits setting stage is for preparing the input data (e.g., test bits included in the input signal IN) and the BIST operation stage is for testing the memory macro 100.

At the beginning of the test bit setting stage, the clock bias voltage VBIAS is increased to a predetermined level for setting the frequency range of the oscillator 211. The test mode reset signal TM_RST is enabled (i.e., switched from a low logic level to a high logic level) for resetting the data stored in the test bit register 212. In one embodiment, the test mode reset signal TM_RST is configured to set the test bits stored in the test bit register 212 to a default value. In another embodiment, the test mode reset signal TM_RST is configured to set a default test data set, but this disclosure is not limited thereto. The default test data set is configured to be provided to the pattern generator 230 while there is no input signal IN received by the high speed test clock 210. In other words, the default test data set is pre-stored in the test bit register 212 in case that there is not input signal IN received by the high speed clock 210. That is, the memory test circuit 300 is able to perform BIST operation without the input signal IN. However, if a customized BIST operation is required, the input signal IN is provided to the high speed clock 210 to set the test bits different from the default test data set. In one embodiment, after the test bit register 212 is reset, the input signal IN including the test bits is provided to the test bit register 212. In one embodiment, the test bits include a series of low logic level (e.g., logic 0) and high logic level (e.g., logic 1). In one embodiment, the input signal IN is provided with the external clock signal CLK_EXT and the external clock CLK_EXT is configured to carry the data of the input signal IN (e.g., the test bits). The test bits of the input signal IN are provided to the test bit register 212 and stored in the test bit register 212. At this time, the test bits are set and the test bits setting stage ends.

At the beginning of the BIST operation stage, the test mode enable signal TM_EN is enabled to start the BIST operation. After the BIST operation starts, the oscillator clock signal CLK_OSC is output by the oscillator 211 (e.g., a voltage controlled oscillator). In one embodiment, the frequency of the oscillator clock signal is determined based on the clock bias voltage VBIAS. During the BIST operation stage, the test signal TST including the pattern signal PT based on the test bits of the input signal IN is generated and provided to the memory macro 100. The readout signal RO corresponding to the test signal TST written to the memory macro 100 is read out and then compared with the test signal TST.

In this manner, memory testing may be performed within the memory chip. Further, since the test signal TST is provided by the build-in circuit (e.g., memory test circuit 200 or memory test circuit 300) disposed (e.g., embedded) in the same memory chip where the memory macro 100 is disposed, the frequency of the test signal TST is not limited by the interface of the memory chip. Therefore, the high speed memory testing of the memory macro 100 is achieved by the memory test circuit 200 or the memory test circuit 300.

Figure 5:
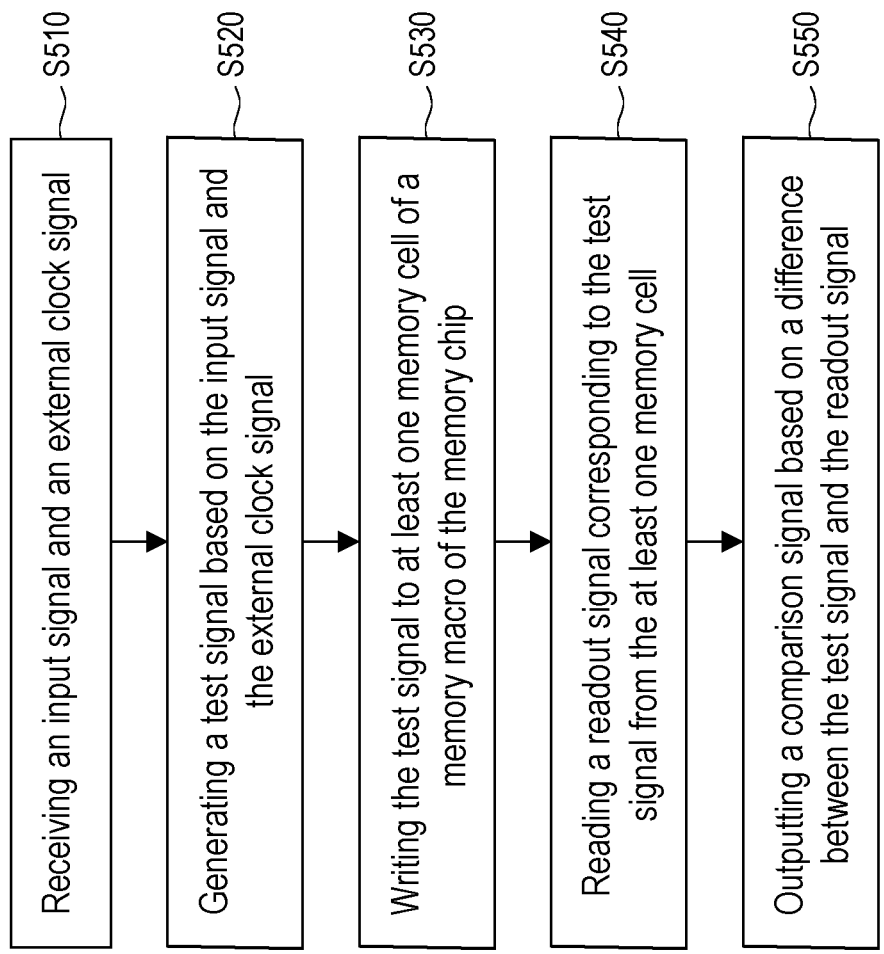
FIG. 5 is a schematic flowchart of a testing method of a memory macro in accordance with some embodiments of the present disclosure.

FIG. 5 is a schematic flowchart of a testing method of a memory macro in accordance with some embodiments of the present disclosure. Referring to FIG. 2 to FIG. 5, the testing method of the memory array comprising: step S510, step S520, step S530, step S540, and step S550.

In the step S510, the input signal IN and the external clock signal CLK_EXT are received by the high speed clock 210 of the memory test circuit 200. In the step S520, the test signal TST is generated by the pattern generator 230 of the memory test circuit 200 based on the input signal IN and the external clock signal CLK_EXT. The pattern type of the patterned signal PT is provided by the FSM controller 220 of the memory test circuit 200 and the test frequency of the test signal TST is determined based on the external clock signal CLK_EXT. In the step S530, the test signal TST is written to the at least one memory cell MC of the memory macro 100 of the memory chip. In the step S540, the readout signal RO corresponding to the test signal TST is read from the at least one memory cell MC. In the step S550, the comparison signal CP is output based on the difference between the test signal TST and the readout signal RO.

In this manner, memory testing may be performed within the memory chip. Further, since the test signal TST is provided by the build-in circuit (e.g., memory test circuit 200 or memory test circuit 300) disposed (e.g., embedded) in the same memory chip where the memory macro 100 is disposed, the frequency of the test signal TST is not limited by the interface of the memory chip. Therefore, the high speed memory testing of the memory macro 100 is achieved by the testing method.

Based on the above, by disposing the memory test circuit within the same chip where the memory macro is disposed, the frequency of the signal for testing the memory macro is not limited by the interface of the memory chip. Therefore, the high speed memory testing of the memory chip is achieved and more conditions may be tested to find out potential issues to improve the user experience.

In one embodiment, the memory test circuit is disposed in a memory chip and electrically coupled to a memory macro of the memory chip. The memory test circuit includes: a high speed clock, configured to receive an input signal and an external clock signal, wherein the input signal includes a plurality of test bits; a finite state machine controller, configured to provide a pattern type; a pattern generator, configured to generate and provide a test signal to at least one memory cell of the memory chip to write the test signal to the at least one memory cell based on the pattern type and the external clock signal, wherein a test frequency of the test signal is determined based on the high speed clock; and an output comparator, configured to output a comparison signal based on a difference between the test signal and a readout signal corresponding to the test signal read from the at least one memory cell.

In a related embodiment, the high speed clock includes an oscillator, wherein the oscillator is configured to provide an oscillator clock signal, and a frequency of the oscillator clock signal is determined based on a clock bias voltage received by the high speed clock.

In a related embodiment, the high speed clock includes an oscillator, wherein the oscillator is configured to provide an oscillator clock signal, and the pattern generator includes a clock generator, wherein the clock generator is configured to generate a test clock signal of the test signal as a work frequency of the memory macro based on the oscillator clock signal.

In a related embodiment, the pattern generator includes an address counter, wherein the address counter is configured to generate an address signal of the test signal based on the input signal, wherein the address signal indicates an address of the at least one memory cell for writing the test signal.

In a related embodiment, in response to receiving the input signal, the finite state machine controller is configured to determine the pattern type based on a type bit of the input signal; and in response to not receiving the input signal, the finite state machine controller is configured to provide a predetermined pattern type based on a predetermined test data set stored in the high speed clock.

In a related embodiment, the pattern type includes at least one of a write operation, a read operation, and an erase operation, and a patterned signal of the test signal includes an instruction of at least one of the write operation, the read operation, and the erase operation of the plurality of test bits.

In a related embodiment, the pattern type includes at least one of a repeated write operation, a repeated read operation, a repeated erase operation, and an alternative write and read operation, and a patterned signal of the test signal includes an instruction of at least one of the repeated write operation, the repeated read operation, the repeated erase operation, and the alternative write and read operation of the plurality of test bits.

In a related embodiment, the pattern generator includes a state register, wherein the state register is configured to generate a patterned signal of the test signal based on the plurality of test bits and the pattern type.

In a related embodiment, the patterned signal of the test signal includes an instruction of at least one of a write operation, a read operation, and an erase operation of the plurality of test bits.

In a related embodiment, the patterned signal of the test signal includes an instruction of at least one of a repeated write operation, a repeated read operation, a repeated erase operation, and an alternative write and read operation of the plurality of test bits.

In a related embodiment, the patterned signal of the test signal includes a plurality of inverted test bits, wherein the plurality of inverted test bits are logically inverted to the plurality of test bits.

In a related embodiment, the pattern generator includes a comparator, wherein the comparator is configured to output the comparison signal based on a difference between the patterned signal of the test signal and the readout signal corresponding to the test signal read from the at least one memory cell.

In another embodiment, the memory chip includes a memory macro; and a memory test circuit, wherein the memory test circuit includes: a high speed clock, configured to receive an input signal, wherein the input signal includes a plurality of test bits; a finite state machine controller, configured to provide a pattern type; a pattern generator, configured to generate and provide a test signal to at least one memory cell of the memory macro to write the test signal to the at least one memory cell based on the pattern type, wherein a test frequency of the test signal is determined based on the high speed clock; and an output comparator, configured to output a comparison signal based on a difference between the test signal and a readout signal corresponding to the test signal read from the at least one memory cell.

In a related embodiment, the high speed clock includes an oscillator, wherein the oscillator is configured to provide an oscillator clock signal, and a frequency of the oscillator clock signal is determined based on a clock bias voltage received by the high speed clock.

In a related embodiment, the high speed clock includes an oscillator, wherein the oscillator is configured to provide an oscillator clock signal, and the pattern generator includes a clock generator, wherein the clock generator is configured to generate a test clock signal of the test signal as a work frequency of the memory macro based on the oscillator clock signal.

In a related embodiment, in response to receiving the input signal, the finite state machine controller is configured to determine the pattern type based on a type bit of the input signal; and in response to not receiving the input signal, the finite state machine controller is configured to provide a predetermined pattern type based on a predetermined test data set stored in the high speed clock.

In a related embodiment, the pattern type includes at least one of a repeated write operation, a repeated read operation, a repeated erase operation, and an alternative write and read operation, and a patterned signal of the test signal includes an instruction of at least one of the repeated write operation, the repeated read operation, the repeated erase operation, and the alternative write and read operation of the plurality of test bits.

In a related embodiment, the pattern generator includes a state register, wherein the state register is configured to generate a patterned signal of the test signal based on the plurality of test bits and the pattern type, and the patterned signal of the test signal includes an instruction of a plurality of inverted test bits, wherein the plurality of inverted test bits are logically inverted to the plurality of test bits.

In a related embodiment, the pattern generator includes a comparator, wherein the comparator is configured to output the comparison signal based on a difference between the patterned signal of the test signal and the readout signal corresponding to the test signal read from the at least one memory cell.

In yet another embodiment, the testing method of a memory array includes: receiving an input signal and an external clock signal; generating a test signal based on the input signal and the external clock signal, wherein a pattern type of the test signal is provided by a finite state machine controller disposed in the memory chip and a test frequency of the test signal is determined based on the a high speed clock disposed in the memory chip; writing the test signal to at least one memory cell of a memory macro of the memory chip; reading a readout signal corresponding to the test signal from the at least one memory cell; and outputting a comparison signal based on a difference between the test signal and the readout signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory test circuit, disposed in a memory chip and electrically coupled to a memory macro of the memory chip, wherein the memory test circuit comprises:
   a high speed clock, configured to receive an input signal and an external clock signal, wherein the input signal comprises a plurality of test bits;
   a finite state machine controller, configured to provide a pattern type;
   a pattern generator, configured to generate and provide a test signal to at least one memory cell of the memory chip to write the test signal to the at least one memory cell based on the pattern type and the external clock signal, wherein a test frequency of the test signal is determined based on; and
   an output comparator, configured to output a comparison signal based on a difference between the test signal and a readout signal corresponding to the test signal read from the at least one memory cell, wherein
   the pattern generator comprises a state register, wherein the state register is configured to generate a patterned signal of the test signal based on the plurality of test bits and the pattern type.

2. The memory test circuit according to claim 1, wherein the high speed clock comprises an oscillator, wherein the oscillator is configured to provide the oscillator clock signal, and a frequency of the oscillator clock signal is determined based on a clock bias voltage received by the high speed clock.

3. The memory test circuit according to claim 1, wherein the high speed clock comprises an oscillator, wherein the oscillator is configured to provide the oscillator clock signal, and
   the pattern generator comprises a clock generator, wherein the clock generator is configured to generate a test clock signal of the test signal as a work frequency of the memory macro based on the oscillator clock signal.

4. The memory test circuit according to claim 1, wherein the pattern generator comprises an address counter, wherein the address counter is configured to generate an address signal of the test signal based on the input signal, wherein the address signal indicates an address of the at least one memory cell for writing the test signal.

5. The memory test circuit according to claim 1, wherein in response to receiving the input signal, the finite state machine controller is configured to determine the pattern type based on a type bit of the input signal; and
   in response to not receiving the input signal, the finite state machine controller is configured to provide a predetermined pattern type based on a predetermined test data set stored in the high speed clock.

6. The memory test circuit according to claim 1, wherein the pattern type comprises at least one of a write operation, a read operation, and an erase operation, and
   the patterned signal of the test signal comprises an instruction of the at least one of the write operation, the read operation, and the erase operation of the plurality of test bits.

7. The memory test circuit according to claim 1, wherein the pattern type comprises at least one of a repeated write operation, a repeated read operation, a repeated erase operation, and an alternative write and read operation, and
   the patterned signal of the test signal comprises an instruction of the at least one of the repeated write operation, the repeated read operation, the repeated erase operation, and the alternative write and read operation of the plurality of test bits.

8. The memory test circuit according to claim 1, wherein the patterned signal of the test signal comprises an instruction of at least one of a write operation, a read operation, and an erase operation of the plurality of test bits.

9. The memory test circuit according to claim 1, wherein the patterned signal of the test signal comprises an instruction of at least one of a repeated write operation, a repeated read operation, a repeated erase operation, and an alternative write and read operation of the plurality of test bits.

10. The memory test circuit according to claim 1, wherein the patterned signal of the test signal comprises a plurality of inverted test bits, wherein the plurality of inverted test bits are logically inverted to the plurality of test bits.

11. The memory test circuit according to claim 1, wherein the output comparator is configured to output the comparison signal based on a difference between the patterned signal of the test signal and the readout signal corresponding to the test signal read from the at least one memory cell.

12. A memory chip, comprising:
    a memory macro; and
    a memory test circuit, wherein the memory test circuit comprises:
    a high speed clock, configured to receive an input signal, wherein the input signal comprises a plurality of test bits;
    a finite state machine controller, configured to provide a pattern type;
    a pattern generator, configured to generate and provide a test signal to at least one memory cell of the memory macro to write the test signal to the at least one memory cell based on the pattern type, wherein a test frequency of the test signal is determined based on; and
    an output comparator, configured to output a comparison signal based on a difference between the test signal and a readout signal corresponding to the test signal read from the at least one memory cell, wherein the high speed clock comprises an oscillator, wherein the oscillator is configured to provide the oscillator clock signal, and a frequency of the oscillator clock signal is determined based on a clock bias voltage received by the high speed clock.

13. The memory chip according to claim 12, wherein the pattern generator comprises a clock generator, wherein the clock generator is configured to generate a test clock signal of the test signal as a work frequency of the memory macro based on the oscillator clock signal.

14. The memory chip according to claim 12, wherein in response to receiving the input signal, the finite state machine controller is configured to determine the pattern type based on a type bit of the input signal; and in response to not receiving the input signal, the finite state machine controller is configured to provide a predetermined pattern type based on a predetermined test data set stored in the high speed clock.

15. The memory chip according to claim 12, wherein the pattern type comprises at least one of a repeated write operation, a repeated read operation, a repeated erase operation, and an alternative write and read operation, and a patterned signal of the test signal comprises an instruction of at least one of the repeated write operation, the repeated read operation, the repeated erase operation, and the alternative write and read operation of the plurality of test bits.

16. The memory chip according to claim 12, wherein the pattern generator comprises a state register, wherein the state register is configured to generate a patterned signal of the test signal based on the plurality of test bits and the pattern type, and the patterned signal of the test signal comprises an instruction of a plurality of inverted test bits, wherein the plurality of inverted test bits are logically inverted to the plurality of test bits.

17. The memory chip according to claim 12, wherein the output comparator is configured to output the comparison signal based on a difference between a patterned signal of the test signal and the readout signal corresponding to the test signal read from the at least one memory cell.

18. A testing method of a memory chip, comprising:

receiving an input signal and an external clock signal;

generating a test signal based on the input signal and the external clock signal, wherein a pattern type of the test signal is provided by a finite state machine controller disposed in the memory chip and a test frequency of the test signal is determined based on an oscillator clock signal provided by an oscillator of a high speed clock embedded in the memory chip where a memory macro to be tested is disposed;

writing the test signal to at least one memory cell of the memory macro of the memory chip;

reading a readout signal corresponding to the test signal from the at least one memory cell; and outputting a comparison signal based on a difference between the test signal and the readout signal.

19. The testing method according to claim 18, further comprising:

in response to receiving the input signal, determining the pattern type based on a type bit of the input signal; and in response to not receiving the input signal, providing a predetermined pattern type based on a predetermined test data set stored in the high speed clock.

20. The testing method according to claim 18, wherein outputting the comparison signal comprises:

outputting the comparison signal based on a difference between a patterned signal of the test signal and the readout signal corresponding to the test signal read from the at least one memory cell.

* * * * *